(12) United States Patent
Kim et al.

(10) Patent No.: US 7,755,133 B2
(45) Date of Patent: Jul. 13, 2010

(54) SEMICONDUCTOR INTEGRATED CIRCUIT DEVICE AND RELATED FABRICATION METHOD

(75) Inventors: Jin-bum Kim, Gwanak-gu (KR);
Young-pil Kim, Suwon-si (KR);
Si-young Choi, Seongnam-si (KR);
Byeong-chan Lee, Yongin-si (KR);
Jong-wook Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 83 days.

(21) Appl. No.: 11/855,529

(22) Filed: Sep. 14, 2007

(65) Prior Publication Data
US 2008/0105930 A1 May 8, 2008

(30) Foreign Application Priority Data
Nov. 3, 2006 (KR) ...................... 10-2006-0108392

(51) Int. Cl.
*H01L 29/788* (2006.01)
(52) U.S. Cl. .................. 257/315; 257/394; 257/377; 257/E29.129; 257/E21.562
(58) Field of Classification Search .............. 257/394, 257/758, 292; 438/396
See application file for complete search history.

(56) References Cited
U.S. PATENT DOCUMENTS
6,355,533 B2 * 3/2002 Lee ........................... 438/366

2003/0230811 A1 * 12/2003 Kim ........................... 257/758
2004/0259295 A1 * 12/2004 Tomiye et al. .............. 438/155
2005/0106838 A1 * 5/2005 Lim et al. .................... 438/442

FOREIGN PATENT DOCUMENTS

| JP | 11003982 | 1/1999 |
| KR | 1020000044929 A | 7/2000 |
| KR | 1020030094742 A | 12/2003 |
| KR | 1020040074347 A | 8/2004 |
| KR | 1020050121479 A | 12/2005 |

* cited by examiner

*Primary Examiner*—Fernando L Toledo
*Assistant Examiner*—Mamadou Diallo
(74) *Attorney, Agent, or Firm*—Volentine & Whitt, PLLC

(57) ABSTRACT

Embodiments of the invention provide a semiconductor integrated circuit device and a method for fabricating the device. The semiconductor device includes a semiconductor substrate having a cell region and a peripheral region, a cell active region formed in the cell region, and a peripheral active region formed in the peripheral region, wherein the cell active region and the peripheral active region are defined by isolation regions. The semiconductor device further includes a first gate stack formed on the cell active region, a second gate stack formed on the peripheral active region, a cell epitaxial layer formed on an exposed portion of the cell active region, and a peripheral epitaxial layer formed on an exposed portion of the peripheral active region, wherein the height of the peripheral epitaxial layer is greater than the height of the cell epitaxial layer.

10 Claims, 8 Drawing Sheets

SEMICONDUCTOR INTEGRATED CIRCUIT DEVICE AND RELATED FABRICATION METHOD

CROSS-REFERENCE TO RELATED APPLICATION

This application claims priority to Korean Patent Application No. 10-2006-0108392, filed on Nov. 3, 2006, the subject matter of which is hereby incorporated by reference in its entirety.

BACKGROUND OF THE INVENTION

1. Field of the Invention

Embodiments of the invention relate to a semiconductor integrated circuit device and a method for fabricating the semiconductor integrated circuit device. In particular, embodiments of the invention relate to a semiconductor integrated circuit device having an epitaxial layer and a method for fabricating the semiconductor integrated circuit device.

2. Description of the Related Art

Techniques for forming elevated source/drain regions have been used in forming semiconductor devices having relatively high degrees of integration. The elevated source/drain regions are formed through a selective epitaxial growth process.

In a selective epitaxial growth process, silicon is selectively grown on an active region of a semiconductor substrate by providing source gases such as dichlorosilane (DCS; $SiH_2Cl_2$) and $SiH_4$.

When a selective epitaxial growth process is performed, an epitaxial layer can be stacked on the active region, which is defined by isolation regions. In the selective epitaxial growth process, the silicon forming the epitaxial layer grows vertically and horizontally. Thus, the silicon can grow onto the surface of an isolation region that is adjacent to the active region on which the epitaxial layer is grown.

Active regions are formed on a semiconductor substrate at regular intervals. Although a relatively large amount of space separates active regions in peripheral regions, a relatively small amount of space separates active regions in cell regions because of relatively small design rules. As a result, when an epitaxial layer extends over and is formed on isolation regions in a cell region, portions of the epitaxial layer that extend from adjacent active regions of the cell region over an isolation region separating the adjacent active regions may become connected and thereby form an active region bridge.

In addition, when the height of the epitaxial layer is adjusted such that the bridge is not formed, the semiconductor device may not benefit from the improved transistor characteristics resulting from forming elevated source/drain regions in the peripheral regions.

SUMMARY OF THE INVENTION

Embodiments of the invention provide a semiconductor integrated circuit device having improved reliability and a method for fabricating the semiconductor integrated circuit device.

In one embodiment, the invention provides a semiconductor device comprising a semiconductor substrate having a cell region and a peripheral region, a cell active region formed in the cell region, and a peripheral active region formed in the peripheral region, wherein the cell active region and the peripheral active region are defined by isolation regions. The semiconductor device further comprises a first gate stack formed on the cell active region, a second gate stack formed on the peripheral active region, a cell epitaxial layer formed on an exposed portion of the cell active region, and a peripheral epitaxial layer formed on an exposed portion of the peripheral active region, wherein the height of the peripheral epitaxial layer is greater than the height of the cell epitaxial layer.

In another embodiment, the invention provides a method for fabricating a semiconductor device comprising defining a cell active region in a cell region of a semiconductor substrate and defining a peripheral active region in a peripheral region of the semiconductor substrate by forming isolation regions in the cell region and the peripheral region, and forming gate stacks on the cell active region and the peripheral active region. The method further comprises forming a cell epitaxial layer on an exposed portion of the cell active region and forming a peripheral epitaxial layer on an exposed portion of the peripheral active region by performing at least one selective epitaxial growth process on the semiconductor substrate, wherein the peripheral epitaxial layer has a greater height than the cell epitaxial layer.

BRIEF DESCRIPTION OF THE DRAWINGS

Embodiments of the invention will be described hereafter with reference to the accompanying drawings, in which.

DESCRIPTION OF EMBODIMENTS

Throughout the specification, like reference symbols indicate like or similar elements. In addition, when a first element or layer is said to be "on" a second element or layer, the first element or layer may be directly on the second element or layer, or intervening elements or layers may be interposed between them. However, when a first element or layer is said to be "directly on" the second element or layer, no intervening elements or layer are present.

Figure 1:
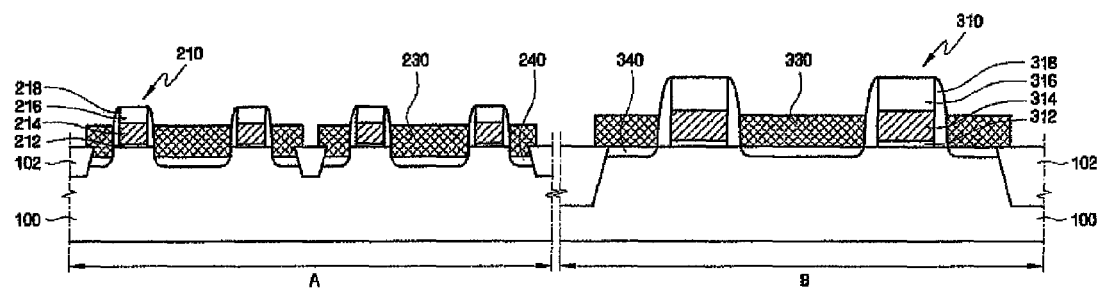
FIG. 1 is a cross-sectional view illustrating a semiconductor integrated circuit device in accordance with an embodiment of the invention.

A semiconductor integrated circuit device in accordance with an embodiment of the invention will now be described with reference to FIG. 1. FIG. 1 is a cross-sectional view illustrating a semiconductor integrated circuit device in accordance with an embodiment of the invention.

Referring to FIG. 1, gate stacks 210 and 310 are disposed on a semiconductor substrate 100.

Semiconductor substrate 100 may be a silicon semiconductor substrate, a SOI (Silicon On Insulator) semiconductor substrate, a gallium arsenide semiconductor substrate, a silicon germanium semiconductor substrate, a ceramic semiconductor substrate, a quartz semiconductor substrate, or a glass semiconductor substrate for display. Semiconductor substrate 100 is typically a p-type semiconductor substrate, and, although not shown in the drawings, further processes may be performed on semiconductor substrate 100 after the process for growing the p-type epitaxial layers on the surface of semiconductor substrate 100 is performed.

Semiconductor substrate 100 is divided into a cell region and a peripheral region. Region A indicates the cell region and region B indicates the peripheral region. In addition, isolation regions 102 formed in semiconductor substrate 100 define active regions in semiconductor substrate 100. An active region disposed in cell region A may be referred to herein as a "cell active region", and an active region disposed in peripheral region B may be referred to herein as a "peripheral active region". Isolation regions 102 may be field oxide (FOX) formed using a local oxidation of silicon (LOCOS) method or shallow trench isolation (STI).

Gate stacks 210 and 310 respectively comprise gate dielectric layers 212 and 312, gates 214 and 314, capping layers 216 and 316, and gate spacers 218 and 318.

A silicon oxidation layer formed by thermal oxidation of semiconductor substrate 100, SiON, GexOyNz, GexSiyOz, high-K material, a combination of these materials, or a stacked layer of these materials can be used as gate dielectric layer 212 and 312. $HfO_2$, $ZrO_2$, $Al_2O_3$, $Ta_2O_5$, hafnium silicate, zirconium silicate, or a combination layer of these materials can be used as the high-k material, but the high-k material is not limited to the preceding list of materials.

Gates 214 and 314 may comprise impurity doped polysilicon. Further, gates 214 and 314 may comprise a metal layer such as W or TiN, and may comprise other material layers if necessary.

Capping layers 216 and 316, which protect gates 214 and 314, can be formed from a nitride layer and may be used as a hard mask during the gate formation process.

In addition, spacers 218 and 318 may be formed from, for example, a nitride layer or an oxynitride layer.

Exposed portions of the cell active regions (i.e., exposed portions of the active regions disposed in cell region A) are recessed below the upper surfaces of isolation regions 102. As used herein, an "exposed portion" of a cell active region is a portion of the cell active region where no gate stack 210 is formed. Likewise, as used herein, an "exposed portion" of a peripheral active region is a portion of the peripheral active region where no gate stack 310 is formed. The recesses have depths relative to upper surfaces of isolation regions 102 that are in a range of about 50 to 200 Å. An elevated cell epitaxial layer 230 is formed on the recessed portions of the cell active regions. An elevated cell epitaxial layer may be referred to herein simply as a cell epitaxial layer and an elevated peripheral epitaxial layer may be referred to herein simply as a peripheral epitaxial layer.

Cell epitaxial layer 230 may comprise silicon or silicon-germanium (SiGe). The height of cell epitaxial layer 230 may be, for example, about 200 to 400 Å. As used herein, "height" and "depth" are both relative to upper surfaces of isolation layers 102. In particular, as used herein, the "height" of a layer is the distance that the upper surface of the layer is disposed above the upper surface of an isolation region 102. In addition, as used herein, a "depth" of a recess is the distance that the bottom surface of the recess is disposed below an upper surface of an isolation layer 102. Thus, when the height of a first layer is said to be greater than the height of a second layer, the upper surface of the first layer is disposed farther above an isolation layer 102 than the upper surface of the second layer. Also, as used herein, the terms "above" and "below" are used relative to the illustrated orientations of the structures shown in the drawings.

Additionally, an elevated peripheral epitaxial layer 330 is formed on exposed portions of the peripheral active region (i.e., portions of the peripheral active region where no gate stack 310 is formed). Peripheral epitaxial layer 330 may comprise, for example, silicon or silicon-germanium, and peripheral epitaxial layer 330 is formed such that it has a greater height than cell epitaxial layer 230. That is, because cell epitaxial layer 230 is formed on recessed portions of cell active regions while peripheral epitaxial layer 330 is formed on portions of the peripheral active region (which is not recessed), the height of peripheral epitaxial layer 330 is greater than the height of cell epitaxial layer 230. The height of peripheral epitaxial layer 330 is in a range of about 300 to 500 Å. Only one peripheral active region is shown in each of the drawings, and embodiments of the invention are described herein with reference to the illustrated peripheral active region. However, a semiconductor integrated circuit device in accordance with an embodiment of the invention may comprise one or more additional peripheral active regions on which substantially the same processes performed on the illustrated peripheral active region may be performed. Likewise, a semiconductor integrated circuit device in accordance with an embodiment of the invention may comprise one or more additional cell active regions on which substantially the same processes performed on the illustrated cell active regions may be performed.

Source/drain regions 240 are formed in part from cell epitaxial layer 230 and in part in portions of semiconductor substrate 100 disposed under cell epitaxial layer 230. Likewise, source/drain regions 340 are formed in part from peripheral epitaxial layer 330 and in part in portions of semiconductor substrate 100 disposed under peripheral epitaxial layer 330. Because source/drain regions 240 and 340 are formed in part from elevated cell epitaxial layer 230 and elevated peripheral epitaxial layer 330, respectively, elevated source/drain regions are formed.

Portions of cell epitaxial layer 230 and peripheral epitaxial layer 330 extend over and are disposed on isolation regions 102, and those portions may be referred to herein as "extending portions". In the embodiment illustrated in FIG. 1, the horizontal length of each extending portion of cell epitaxial layer 230 is shorter than the horizontal length of each extending portion of peripheral epitaxial layer 330. The horizontal length of each extending portion is proportional to the height of the elevated epitaxial layer of which the extending portion is a part (i.e., the corresponding elevated epitaxial layer). Thus, because the height of cell epitaxial layer 230 is less than the height of peripheral epitaxial layer 330, the respective horizontal lengths of the extending portions of cell epitaxial layer 230 are shorter than the respective horizontal lengths of the extending portions of peripheral epitaxial layer 330. In addition, the horizontal length of the extending portion of the cell epitaxial layer may be about 20 to 100 Å and the horizontal length of the extending portion of the peripheral epitaxial layer may be about 50 to 150 Å. As used herein, a "horizontal length" is a length along a dimension substantially parallel to the working surface of the corresponding substrate and extending between left and right sides of the corresponding drawing. Thus, the term "horizontal" is used relative to the illustrated orientations of the structures shown in the drawings.

In cell region A, the space between the active regions, which are separated by isolation regions 102, is narrower than the corresponding space in peripheral region B. If the respective horizontal lengths of the extending portions of epitaxial layer 230 are relatively long, extending portions of epitaxial layer 230 corresponding to adjacent active regions may connect and thereby cause a defect.

In a semiconductor integrated circuit device in accordance with an embodiment of the invention, defects due to extending portions connecting with one another in cell region A can be substantially prevented by forming cell epitaxial layer 230 and peripheral epitaxial layer 330 such that they have different heights. Thus, the reliability of the semiconductor integrated circuit device may be improved.

Hereinafter, a method for fabricating the semiconductor integrated circuit device of FIG. 1 will be described with reference to FIGS. 1 through 6. FIGS. 2 through 6 are cross-sectional views illustrating a method for fabricating a semiconductor integrated circuit device in accordance with an embodiment of the invention.

Figure 2:
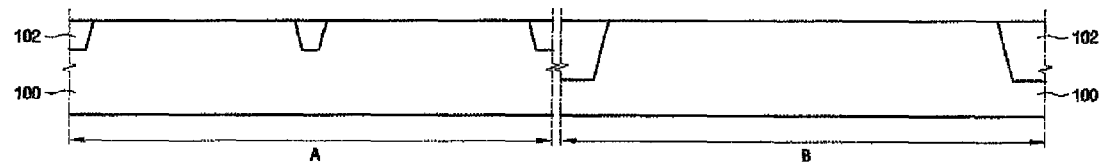
FIGS. 2 through 6 are cross-sectional views illustrating a method for fabricating the semiconductor integrated circuit device of FIG. 1.

Referring to FIG. 2, active regions are defined by forming isolation regions 102 in a semiconductor substrate 100. Semiconductor substrate 100 comprises cell region A and peripheral region B. Because components are smaller in cell region A than in peripheral region B and cell region A has a higher integration density than peripheral region B, the spaces between adjacent active regions are narrower than the corresponding spaces in peripheral region B. Adjacent active regions are separated by isolation regions 102. In addition, in accordance with an embodiment of the invention, a portion of peripheral region B in which relatively small components are formed may be substantially the same as cell region A.

Figure 3:
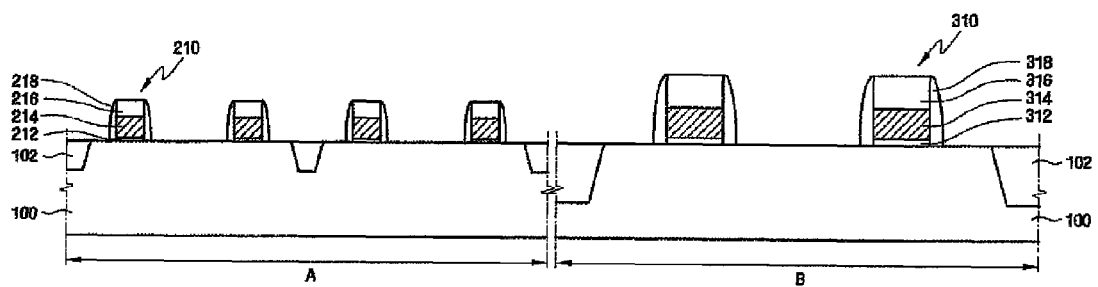

Referring to FIG. 3, gate stacks 210 are formed on active regions of cell region A and gate stacks 310 are formed on an active region of peripheral region B. Gate stack 210 formed in cell region A is formed such that it is smaller than gate stack 310 formed in peripheral region B. In addition, each gate stack 210 formed in cell region A comprises a gate dielectric layer 212, a gate 214, a capping layer 216, and spacers 218. Also, each gate stack 310 formed in peripheral region B comprises a gate dielectric layer 312, a gate 314, a capping layer 316, and spacers 318.

Figure 4:
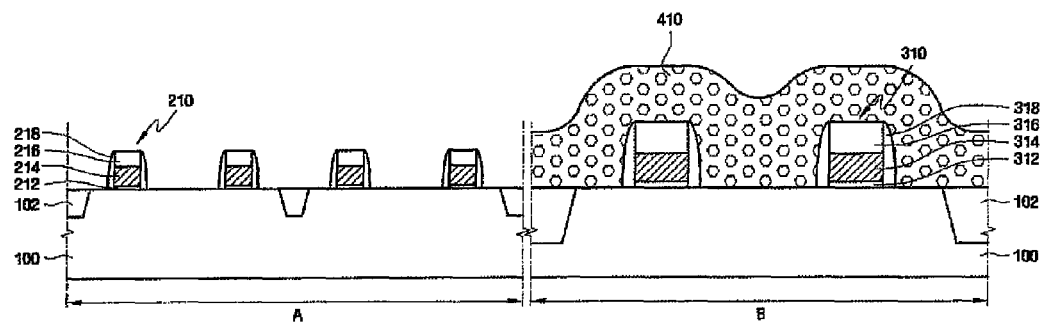

Next, referring to FIG. 4, a mask pattern 410 is formed in peripheral region B. Mask pattern 410 may be, for example, a photoresist pattern. Specifically, mask pattern 410 may be formed in peripheral region B by coating photoresist on the entire surface of semiconductor substrate 100 and then removing the photoresist from cell region A using a photo-etching process.

Figure 5:
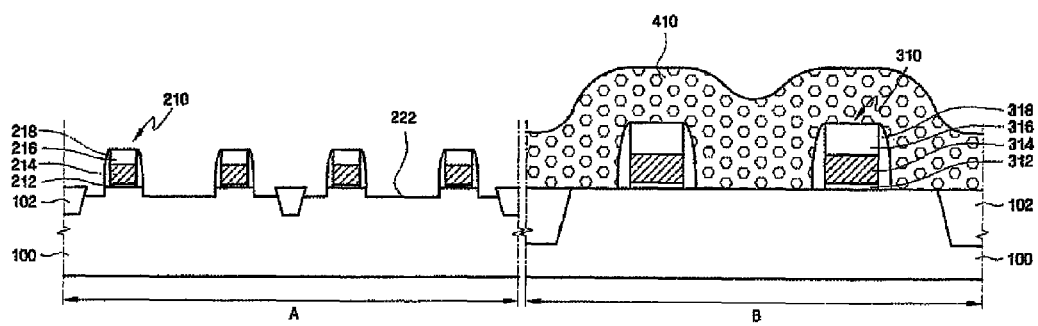

Next, referring to FIG. 5, recesses 222 are formed by etching exposed portions of the active regions of cell region A. The etching process may be, for example, an etch back process. Recesses 222 may be formed having a depth of about 50 to 200 Å relative to upper surfaces of isolation regions 102. Then, mask pattern 410 disposed in peripheral region B is removed.

Figure 6:
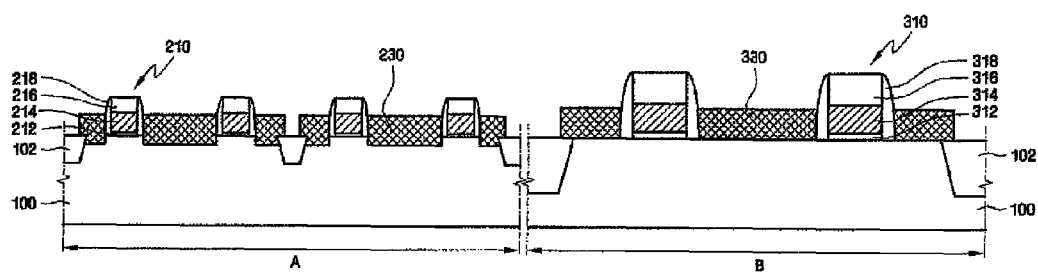

Next, referring to FIG. 6, a selective epitaxial growth process is performed on the entire surface of semiconductor substrate 100 to form an elevated cell epitaxial layer 230 on the exposed portions of the cell active regions and to form an elevated peripheral epitaxial layer 330 on the exposed portions of the peripheral active region.

The selective epitaxial growth process can be performed by performing a chemical vapor deposition (CVD) process, a reduced pressure chemical vapor deposition (RPCVD) process, or an ultra high vacuum chemical vapor deposition (UHVCVD) process, but performing the selective epitaxial growth process is not limited to performing one of those processes. The selective epitaxial growth process can be performed by providing source gas, which may comprise $SiH_4$, dichlorosilane ($SiH_2Cl_2$; DCS), and trichlorosilane ($SiHCl_3$; TCS).

Through the selective epitaxial growth process, cell epitaxial layer 230 is formed on recesses 222 formed in the exposed portions of the cell active regions. Cell epitaxial layer 230 may comprise, for example, silicon (Si) or silicon-germanium (SiGe), and the height of cell epitaxial layer 230 is in a range of about 200 to 400 Å.

In addition, a peripheral epitaxial layer 330 is formed on the portions of the peripheral active region where no gate stack 310 is formed (i.e., exposed portions of the peripheral active region). Peripheral epitaxial layer 330 may comprise, for example, silicon (Si) or silicon-germanium (SiGe), and peripheral epitaxial layer 330 is formed such that the height of peripheral epitaxial layer 330 is greater than the height of cell epitaxial layer 230. That is, since cell epitaxial layer 230 is formed in recesses 222 while peripheral epitaxial layer 330 is formed on exposed portions of the peripheral active region that are not recessed, the height of peripheral epitaxial layer 330 is greater than the height of cell epitaxial layer 230. The height of peripheral epitaxial layer 330 is in a range of about 300 to 500 Å.

Portions of each of cell epitaxial layer 230 and peripheral epitaxial layer 330 extend over and are formed on isolation regions 102, and those portions may be referred to herein as "extending portions". The respective horizontal lengths of the extending portions of cell epitaxial layer 230 are shorter than the respective horizontal lengths of the extending portions of peripheral epitaxial layer 330. The horizontal length of the extending portion of an epitaxial layer is proportional to the height of the epitaxial layer. Thus, because the height of cell epitaxial layer 230 is smaller than the height of peripheral epitaxial layer 330, the horizontal length of an extending portion of cell epitaxial layer 230 is smaller than the horizontal length of an extending portion of peripheral epitaxial layer 330.

Next, referring to FIG. 1, elevated source/drain regions 240 and 340 are formed by performing an ion implantation process on semiconductor substrate 100.

As a result, source/drain regions 240 are formed in part from cell epitaxial layer 230 and in part in portions of semiconductor substrate 100 disposed under cell epitaxial layer 230. Likewise, source/drain regions 340 are formed in part from peripheral epitaxial layer 330 and in part in portions of semiconductor substrate 100 disposed under peripheral epitaxial layer 330.

When forming an n-type transistor, highly concentrated arsenic (As) or phosphorous (P) may be implanted with energy on the order of tens of keV to form elevated source/drain regions 240 and 340. When forming a p-type transistor, highly concentrated boron (B) may be implanted with energy on the order of tens of keV to form elevated source/drain regions 240 and 340.

Figure 7:
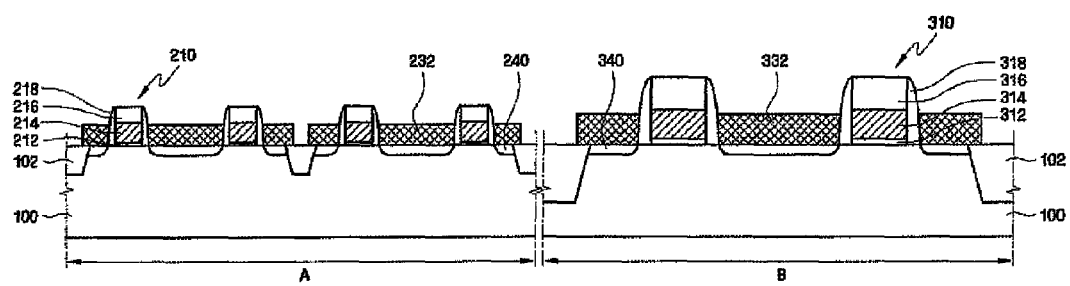
FIG. 7 is a cross-sectional view illustrating a semiconductor integrated circuit device in accordance with another embodiment of the invention.

A semiconductor integrated circuit device in accordance with another embodiment of the invention will be described with reference to FIG. 7. FIG. 7 is a cross-sectional view illustrating a semiconductor integrated circuit device in accordance with another embodiment of the invention. Throughout the drawings, like reference symbols are used to indicate like or similar elements. Thus, further description of elements that have been described previously may be omitted.

Unlike the embodiment illustrated in FIG. 1, in the embodiment illustrated in FIG. 7, no recesses are formed in the cell active regions.

Referring to FIG. 7, gate stacks 210 and 310 are formed on a semiconductor substrate 100, and gate stacks 210 and 310 respectively comprise gate dielectric layers 212 and 312, gates 214 and 314, capping layers 216 and 316, and spacers 218 and 318.

An elevated cell epitaxial layer 232 is formed on the portions of the cell active regions where no gate stack 210 is formed (i.e., on exposed portions of the cell active regions). Cell epitaxial layer 232 may comprise, for example, silicon (Si) or silicon-germanium (SiGe). The height of elevated cell epitaxial layer 232 is in a range of about 200 to 400 Å.

In addition, an elevated peripheral epitaxial layer 332 is formed on the portions of the active region of peripheral region B where no gate stack 310 is formed (i.e., on exposed portions of the peripheral active region). Peripheral epitaxial layer 332 may comprise, for example, silicon (Si) or silicon-germanium (SiGe), and peripheral epitaxial layer 332 is formed such that the height of peripheral epitaxial layer 332 is greater than the height of cell epitaxial layer 232. The height of peripheral epitaxial layer 332 may be about 300 to 500 Å.

Source/drain regions 240 are formed in part from cell epitaxial layer 232 and in part in portions of semiconductor substrate 100 disposed under cell epitaxial layer 232. Likewise, source/drain regions 340 are formed in part from peripheral epitaxial layer 332 and in part in portions of semiconductor substrate 100 disposed under peripheral epitaxial layer 332. Because source/drain regions 240 and 340 are formed in part from elevated cell epitaxial layer 232 and elevated peripheral epitaxial layer 332, respectively, elevated source/drain regions are formed.

Portions of cell epitaxial layer 232 and peripheral epitaxial layer 332 extend over and are formed on isolation regions 102, and those portions may be referred to herein as "extending portions". The horizontal length of an extending portion of cell epitaxial layer 232 is shorter than the horizontal length of an extending portion peripheral epitaxial layer 332. The horizontal length of an extending portion of an epitaxial layer is proportional to the height of the epitaxial layer. Thus, because cell epitaxial layer 232 has a smaller height than peripheral epitaxial layer 332, the horizontal length of an extending portion of cell epitaxial layer 232 is shorter than the horizontal length of an extending portion of peripheral epitaxial layer 332.

A semiconductor integrated circuit device in accordance with an embodiment of the invention can substantially prevent defects caused by portions of an epitaxial layer corresponding to adjacent active regions connecting to one another in cell region A by forming cell epitaxial layer 232 and peripheral epitaxial layer 332 such that they have different heights.

Hereinafter, a method for fabricating the semiconductor integrated circuit device illustrated in FIG. 7 will be described with reference to FIGS. 7 through 12. FIGS. 8 through 12 are cross-sectional views illustrating a method for fabricating the semiconductor integrated circuit device of FIG. 7.

Figure 8:
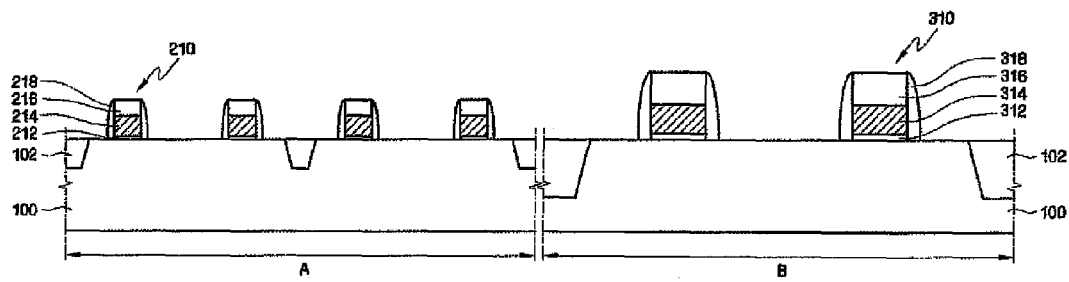
FIGS. 8 through 12 are cross-sectional views illustrating a method for fabricating the semiconductor integrated circuit device of FIG. 7.

First, referring to FIG. 8, active regions are defined by forming isolation regions 102 on semiconductor substrate 100 having a cell region A and a peripheral region B. Gate stacks 210 and 310 are then formed on the active regions of both cell region A and peripheral region B.

Gate stacks 210 formed in cell region A are smaller than gate stacks 310 formed in peripheral region B. Each of gate stacks 210 formed in cell region A comprises a gate dielectric layer 212, a gate 214, a capping layer 216, and a spacer 218. In addition, each of gate stacks 310 formed in peripheral region B comprises a gate dielectric layer 312, a gate 314, a capping layer 316, and spacer 318.

Figure 9:
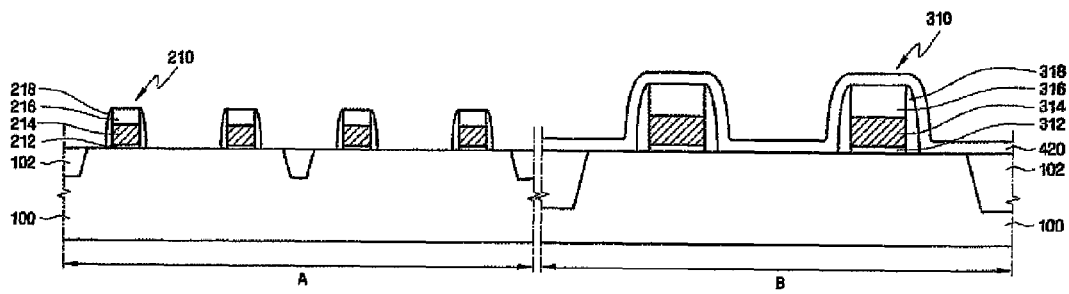

Next, referring to FIG. 9, a first mask pattern 420 is formed in peripheral region B. In particular, a mask layer (not shown) is formed on the entire surface of semiconductor substrate 100, and the portion of the mask layer formed in cell region A is then removed by performing a photoetching process. As a result, first mask pattern 420 is formed on only peripheral region B.

Figure 10:
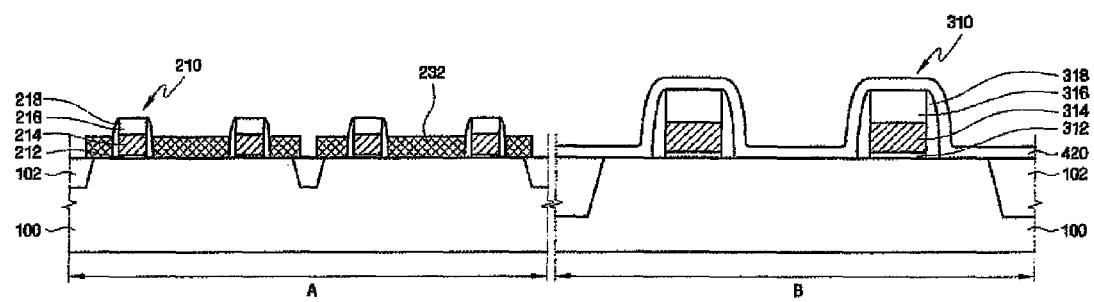

Next, referring to FIG. 10, an elevated cell epitaxial layer 232 is formed on the exposed portions of the active regions of cell region A (i.e., the exposed portions of the cell active regions) by performing a selective epitaxial growth process on cell region A. That is, selective epitaxial growth is performed only in cell region A. The height of elevated cell epitaxial layer 232 is in a range of about 200 to 400 Å.

Figure 11:
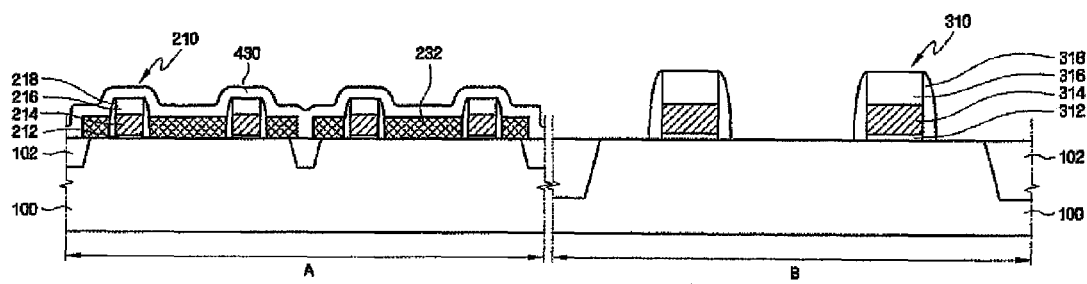

Next, referring to FIG. 11, first mask pattern 420 (of FIG. 10) disposed in peripheral region B is removed, and a second mask pattern 430 is formed in cell region A.

First mask pattern 420 is removed by performing an etching process. Then, another mask layer (not shown) is formed on the entire surface of semiconductor substrate 100, and the portion of the mask layer that is disposed on peripheral region B is then removed. As a result, second mask pattern 430 is formed only in cell region A.

Alternatively, before removing first mask layer 420, a mask layer may be formed on the entire surface of semiconductor substrate 100, including on first mask pattern 420. Then the portion of the mask layer formed on peripheral region B and first mask pattern 420 may be removed by performing a photoetching process. As a result, second mask pattern 430 may be formed on only cell region A.

Figure 12:
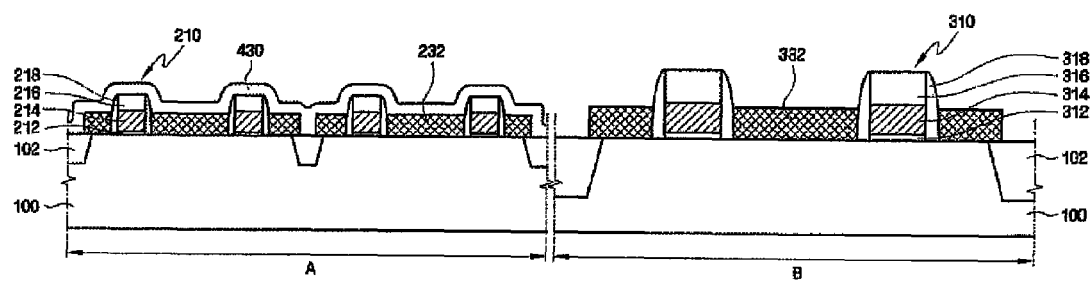

Next, referring to FIG. 12, selective epitaxial growth is performed in peripheral region B such that an elevated peripheral epitaxial layer 332 having a height that is greater than that of cell epitaxial layer 232 is formed on top of the exposed portions of the peripheral active region. The height of peripheral epitaxial layer 332 is in a range of about 300 to 500 Å.

Portions of cell epitaxial layer 232 and peripheral epitaxial layer 332 extend over and are formed on isolation regions 102, and those portions may be referred to herein as "extending portions". The horizontal length of an extending portion is proportional to the height of the corresponding elevated epitaxial layer. Thus, the horizontal length of an extending portion of elevated cell epitaxial layer 232 is shorter than the horizontal length of an extending portion of peripheral epitaxial layer 332.

Next, referring to FIG. 7, elevated source/drain regions 240 and 340 are formed by performing an ion implantation process on semiconductor substrate 100.

That is, source/drain regions 240 and 340 are formed in part from elevated cell epitaxial layer 232 and peripheral epitaxial layer 332, respectively, and are formed in part in semiconductor substrate 100.

In the embodiment illustrated in FIGS. 7 through 12, selective epitaxial growth is performed in peripheral region B after selective epitaxial growth is performed in cell region A. Alternatively, selective epitaxial growth may be performed in peripheral region B before selective epitaxial growth is performed in cell region A.

Figure 13:
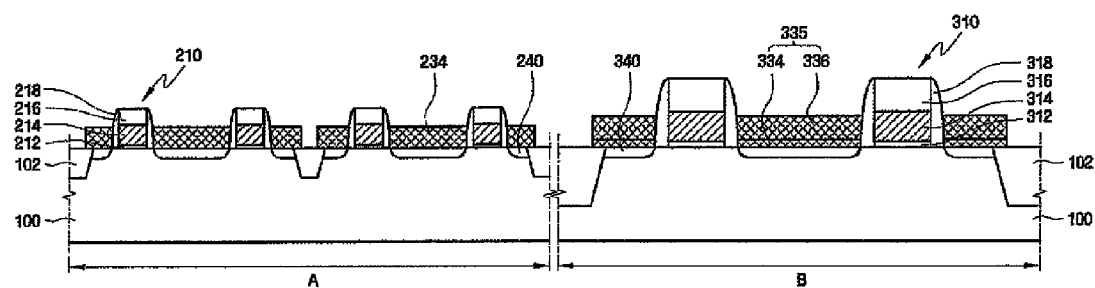
FIG. 13 is a cross-sectional view illustrating a semiconductor integrated circuit device in accordance with another embodiment of the invention.

Hereinafter, a semiconductor integrated circuit device in accordance with another embodiment of the invention will be described with reference to FIG. 13. FIG. 13 is a cross-sectional view illustrating a semiconductor integrated circuit device in accordance with another embodiment of the invention.

Unlike in embodiments described previously, in the embodiment illustrated in FIG. 13, peripheral epitaxial layer 335 is formed in two layers.

Referring to FIG. 13, gate stacks 210 and 310 are formed on a semiconductor substrate 100, and gate stacks 210 and 310 respectively comprise gate dielectric layers 212 and 312, gates 214 and 314, capping layers 216 and 316, and spacers 218 and 318.

In addition, an elevated cell epitaxial layer 234 is formed on portions of the active regions of cell region A where no gate stack 210 is formed (i.e., on exposed portions of cell active regions). Cell epitaxial layer 234 may comprise, for example, silicon (Si) or silicon-germanium (SiGe). The height of elevated cell epitaxial layer 234 is in a range of about 200 to 400 Å.

A peripheral epitaxial layer 335 is formed on portions of the active region of peripheral region B where no gate stack 310 is formed (i.e., on exposed portions of the peripheral active region). Peripheral epitaxial layer 335 comprises a first epitaxial layer 334 and a second epitaxial layer 336. The height of second epitaxial layer 336 is the same as the height of cell epitaxial layer 234. That is, peripheral epitaxial layer 335 is formed such that it has a greater height than cell epitaxial layer 234. Elevated peripheral epitaxial layer 335 may comprise, for example, silicon (Si) or silicon-germanium (SiGe). The height of peripheral epitaxial layer 335 is in a range of about 300 to 500 Å.

Source/drain regions 240 are formed in part from cell epitaxial layer 234 and in part in portions of semiconductor substrate 100 disposed under cell epitaxial layer 234. Likewise, source/drain regions 340 are formed in part from peripheral epitaxial layer 335 and in part in portions of semiconductor substrate 100 disposed under peripheral epitaxial layer 335. Because source/drain regions 240 and 340 are formed in part from elevated cell epitaxial layer 234 and peripheral epitaxial layer 335, respectively, elevated source/drain regions are formed.

Portions of cell epitaxial layer 234 and peripheral epitaxial layer 335 extend over and are formed on isolation region 102, and those portions may be referred to herein as "extending portions". The horizontal length of an extending portion of cell epitaxial layer 234 is shorter than the horizontal length of an extending portion of peripheral epitaxial layer 335. The horizontal length of an extending portion of an epitaxial layer is proportional to the height of the epitaxial layer. Thus, the horizontal length of an extending portion of elevated cell epitaxial layer 234 is shorter than the horizontal length of an extending portion of peripheral epitaxial layer 335 because the height of elevated cell epitaxial layer 234 is less than the height of peripheral epitaxial layer 335.

Hereinafter, a method for fabricating the semiconductor integrated circuit device of FIG. 13 will be described with reference to FIGS. 13 through 18. FIGS. 14 through 18 are cross-sectional views illustrating a method of fabricating the semiconductor integrated circuit device of FIG. 13.

Figure 14:
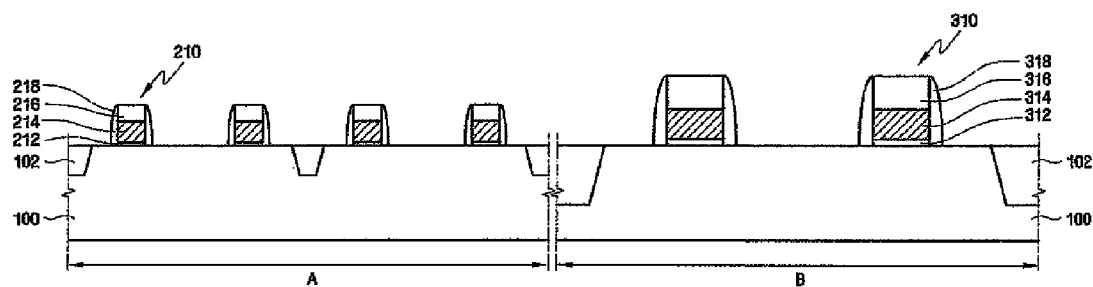
FIGS. 14 through 18 are cross-sectional views illustrating a method for fabricating the semiconductor integrated circuit device of FIG. 13.

First, referring to FIG. 14, active regions are defined in a semiconductor substrate 100 having a cell region A and a peripheral region B by forming isolation regions 102 in cell region A and peripheral region B of semiconductor substrate 100. Gate stacks 210, 310 are then formed on the active regions on both of cell region A and peripheral region B (i.e., in the cell active regions and the peripheral active region).

Gate stacks 210 formed in cell region A are smaller than gate stacks 310 formed in peripheral region B. Further, each gate stack 210 formed in cell region A comprises a gate dielectric layer 212, a gate 214, a capping layer 216, and spacers 218. In addition, each gate stack 310 formed in peripheral region B comprises a gate dielectric layer 312, a gate 314, a capping layer 316, and spacers 318.

Figure 15:
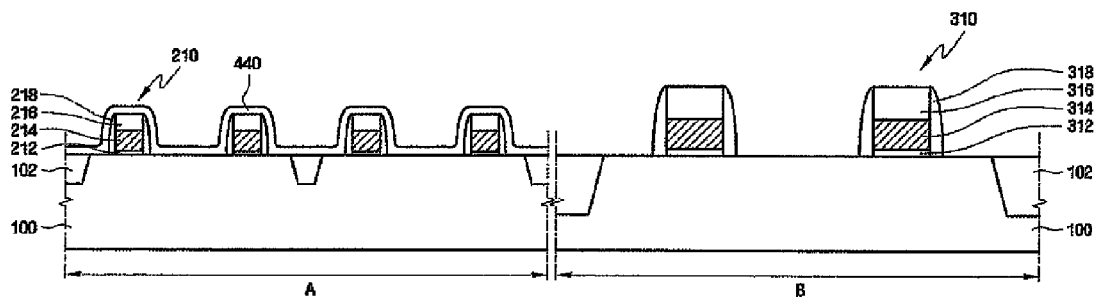

Next, referring to FIG. 15, a mask pattern 440 is formed in cell region A. In particular, a mask layer (not shown) is formed on the entire surface of semiconductor substrate 100, and then the portion of the mask layer disposed in peripheral region B is removed by performing a photo-etching process. As a result, mask pattern 440 is formed in cell region A only.

Figure 16:
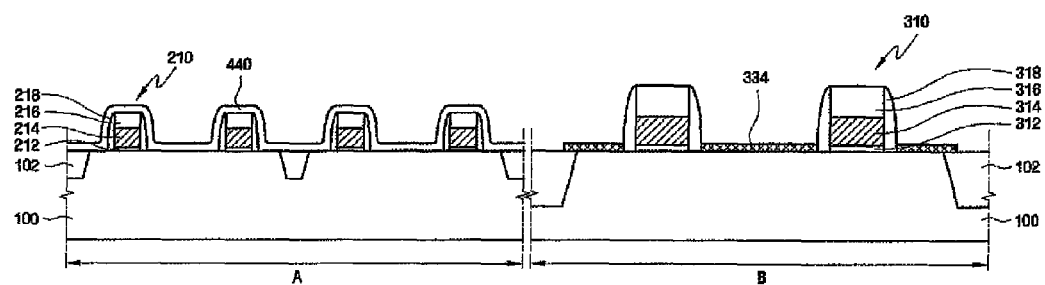

Next, referring to FIG. 16, an elevated first epitaxial layer 334 is formed on exposed portions of the peripheral active region by performing selective epitaxial growth in peripheral region B. That is, selective epitaxial growth is performed in peripheral region B only. The height of first epitaxial layer 334 is in a range of about 50 to 200 Å.

Figure 17:
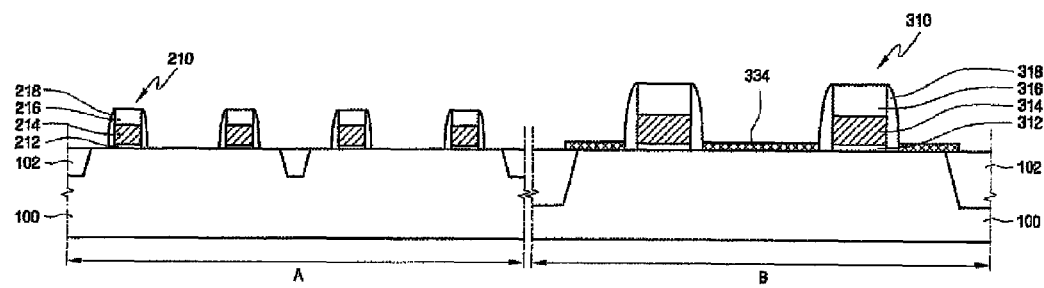

Next, referring to FIG. 17, first mask pattern 440 is removed from cell region A. As illustrated in FIG. 17, first epitaxial layer 334 has only been formed on peripheral region B, and, in particular, first epitaxial layer 334 has been formed on the peripheral active region.

Figure 18:
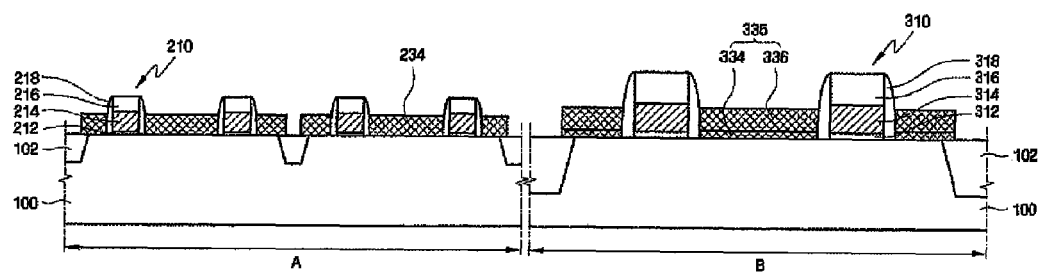

Next, referring to FIG. 18, selective epitaxial growth is performed on the entire surface of semiconductor substrate 100 to form cell epitaxial layer 234 on exposed portions of the cell active regions, and to form a second epitaxial layer 336 on first epitaxial layer 334 in peripheral region B. Thus, a peripheral epitaxial layer 335 comprising first and second epitaxial layers 334 and 336 is formed.

The height of cell epitaxial layer 234 is, for example, in a range of about 200 to 400 Å, and the height of peripheral epitaxial layer 335 is, for example, in a range of about 300 to 500 Å.

Portions of cell epitaxial layer 234 and peripheral epitaxial layer 335 extend over and are formed on isolation regions 102, and those portions may be referred to herein as "extending portions". Cell epitaxial layer 234 has a smaller height than peripheral epitaxial layer 335. Thus, because the horizontal length of an extending portion of an epitaxial layer is proportional to the height of the epitaxial layer, the horizontal length of an extending portion of cell epitaxial layer 234 is less than the horizontal length of an extending portion of peripheral epitaxial layer 335.

Next, referring to FIG. 13, elevated source/drain regions 240 and 340 are formed by performing an ion implantation process on semiconductor substrate 100. That is, source/drain regions 240 are formed in part from elevated cell epitaxial layer 234 and in part in semiconductor substrate 100. Likewise, source/drain regions 340 are formed in part from peripheral epitaxial layer 335 and in part in semiconductor substrate 100.

Figure 19:
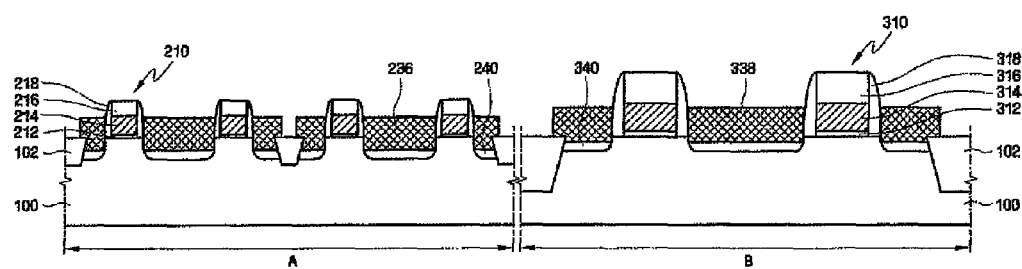
FIG. 19 is a cross-sectional view illustrating a semiconductor integrated circuit device in accordance with another embodiment of the invention; and, FIGS. 20 through 22 are cross-sectional views illustrating a method for fabricating the semiconductor integrated circuit device of FIG. 19.

Hereinafter, a semiconductor integrated circuit device in accordance with another embodiment of the invention will be described with reference to FIG. 19. FIG. 19 is a cross-sectional view illustrating a semiconductor integrated circuit device in accordance with another embodiment of the invention.

Unlike in previously described embodiments, in the embodiment illustrated in FIG. 19, recesses are formed in both a cell region A and a peripheral region B of a semiconductor substrate 100.

Referring to FIG. 19, gate stacks 210 and 310 are formed on semiconductor substrate 100, and gate stacks 210 and 310 respectively comprise gate dielectric layers 212 and 312, gates 214 and 314, capping layers 216 and 316, and spacers 218 and 318.

Portions of cell active regions of cell region A where no gate stack 210 is formed (i.e., exposed cell active regions) are recessed such that bottom surfaces of the recesses are disposed below isolation regions 102. An elevated cell epitaxial layer 236 is formed on recesses (i.e., recesses 224 of FIG. 21). Cell epitaxial layer 236 may comprise, for example, silicon (Si) or silicon-germanium (SiGe). The elevated height of cell epitaxial layer 236 is in a range of about 200 to 400 Å.

Figure 21:
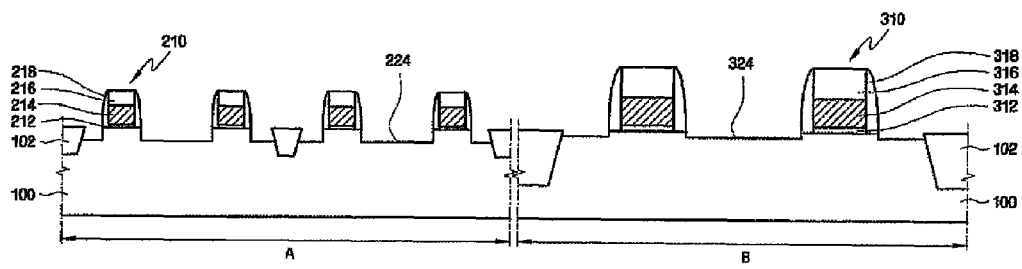

Further, portions of an active region of peripheral region B where no gate stack 310 is formed (i.e., exposed portions of the peripheral active region) are recessed such that bottom surfaces of the recesses are disposed below isolation regions 102. In addition, an elevated peripheral epitaxial layer 338 is formed on the recesses (i.e., recesses 324 of FIG. 21). The difference between the depths of the recesses (224) formed in cell region A and the depths of recesses (324) formed in peripheral region B is in a range of about 50 to 200 Å. Also, as illustrated in FIG. 21, a recess 224 formed in cell region A has a greater depth than a recess 324 formed in peripheral region B.

Elevated peripheral epitaxial layer 338 may comprise, for example, silicon (Si) or silicon-germanium (SiGe), and the height of peripheral epitaxial layer 338 is in a range of about 300 to 500 Å, for example.

Source/drain regions 240 are formed in part from cell epitaxial layer 236 and in part in portions of semiconductor substrate 100 disposed under cell epitaxial layer 236. Likewise, source/drain regions 340 are formed in part from peripheral epitaxial layer 338 and in part in portions of semiconductor substrate 100 disposed under peripheral epitaxial layer 338. Because source/drain regions 240 and 340 are formed in part from elevated cell epitaxial layer 236 and peripheral epitaxial layer 338, respectively, elevated source/drain regions are formed.

Portions of cell epitaxial layer 236 and peripheral epitaxial layer 338 extend over and are formed on isolation regions 102, and those portions may be referred to herein as "extending portions". The horizontal length of an extending portion of cell epitaxial layer 236 is shorter than the horizontal length of an extending portion of peripheral epitaxial layer 338. The horizontal length of an extending portion of an epitaxial layer is proportional to the height of the epitaxial layer. Thus, because cell epitaxial layer 236 has a smaller height than peripheral epitaxial layer 338, the horizontal length of an extending portion of cell epitaxial layer 236 is smaller than the horizontal length of an extending portion of peripheral epitaxial layer 338.

Figure 20:
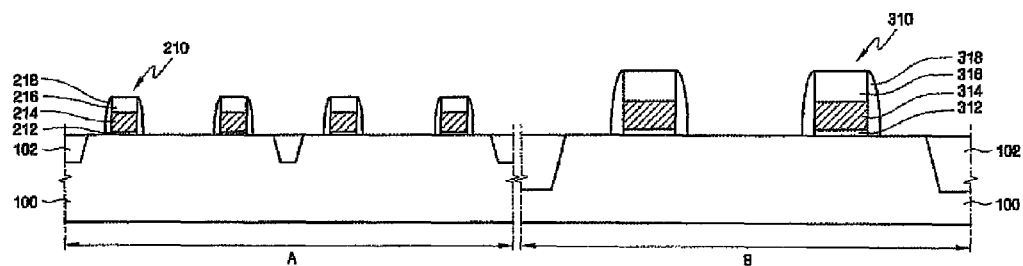
Figure 22:
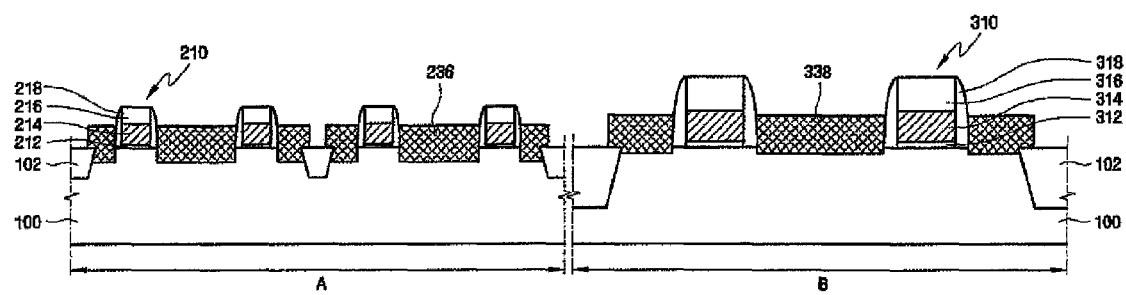

Hereinafter, a method for fabricating the semiconductor integrated circuit device of FIG. 19 will be described with reference to FIGS. 19 through 22. FIGS. 20 through 22 are cross-sectional views illustrating a method for fabricating a semiconductor integrated circuit device in accordance with another embodiment of the invention.

First, referring to FIG. 20, active regions are defined by forming isolation regions 102 in a semiconductor substrate 100 comprising a cell region A and a peripheral region B. Gate stacks 210 and 310 are then formed on active regions of both of cell region A and peripheral region B.

Gate stacks 210 formed in cell region A are each smaller than gate stacks 310 formed in peripheral region B. Each gate stack 210 formed in cell region A comprises a gate dielectric layer 212, a gate 214, a capping layer 216, and spacers 218. In addition, each gate stack 310 formed in peripheral region B comprises a gate dielectric layer 312, a gate 314, a capping layer 316, and spacers 318.

Next, referring to FIG. 21, an etching process is performed to recess exposed portions of active regions of semiconductor substrate 100. The depth of a recess 224 formed in cell region A is greater than the depth of a recess 324 formed in peripheral region B.

The etching process for forming recesses 224 and 324 can be performed by providing gas having chlorine (Cl) atoms such as HCl, Cl$_2$, and others at a temperature of about 500 to 1000 Å. The exposed portions of active regions of cell region A (i.e., the exposed portions of the cell active regions) are smaller than the exposed portions of the active region of peripheral region B (i.e., the exposed portions of the peripheral active region), so the exposed portions of the cell active regions are etched to a greater depth than the exposed portion of the peripheral active region. Thus, recesses 224 formed in cell region A are deeper than recesses 324 formed in peripheral region B. That is, the lower surfaces of recesses 224 are disposed further below the upper surfaces of isolation regions 102 than the lower surfaces of recesses 324.

Referring to FIG. 22, by performing a selective epitaxial growth process on semiconductor substrate 100, an elevated cell epitaxial layer 236 is formed on the cell active regions and an elevated peripheral epitaxial layer 338 is formed on the peripheral active region. Since recesses 224 (of FIG. 21) formed in cell region A are deeper than recesses 324 (of FIG. 21) formed in peripheral region B, the height of peripheral epitaxial layer 338 is greater than the height of cell epitaxial layer 236.

The recess-formation process and the selective epitaxial growth process can be performed in situ.

Referring to FIG. 19, elevated source/drain regions 240 and 340 are formed by performing ion implantation on semiconductor substrate 100.

In accordance with embodiments of the invention, the defects caused by the formation of a bridge between portions of an epitaxial layer corresponding to adjacent active regions may be reduced. That is, a semiconductor integrated circuit device in accordance with an embodiment of the invention may have improved reliability.

Although embodiments of the invention have been described herein, modifications may be made to those embodiments by one skilled in the art without departing from the scope of the invention as defined by the accompanying claims.

What is claimed is:

1. A semiconductor device comprising:
    a semiconductor substrate having a cell region and a peripheral region;
    a cell active region formed in the cell region;
    a peripheral active region formed in the peripheral region, wherein the cell active region and the peripheral active region are defined by isolation regions;
    a first gate stack formed on the cell active region;
    a second gate stack formed on the peripheral active region;
    a cell epitaxial layer formed on an exposed portion of the cell active region and comprising an extending portion disposed on a first isolation region of the isolation regions; and,
    a peripheral epitaxial layer formed on an exposed portion of the peripheral active region and comprising an extending portion disposed on a second isolation region of the isolation regions, wherein the height of the peripheral epitaxial layer is greater than the height of the cell epitaxial layer, and the horizontal length of the extending portion of the cell epitaxial layer is shorter than the horizontal length of the extending portion of the peripheral epitaxial layer.

2. The semiconductor device of claim 1, wherein the height of the cell epitaxial layer is about 200 to 400 Å.

3. The semiconductor device of claim 2, wherein the horizontal length of the extending portion of the cell epitaxial layer is about 20 to 100 Å.

4. The semiconductor device of claim 1, wherein the height of the peripheral epitaxial layer is about 300 to 500 Å.

5. The semiconductor device of claim 4, wherein the horizontal length of the extending portion of the peripheral epitaxial layer is about 50 to 150 Å.

6. A semiconductor device comprising:
- a semiconductor substrate having a cell region and a peripheral region;
- a cell active region formed in the cell region;
- a peripheral active region formed in the peripheral region, wherein the cell active region and the peripheral active region are defined by isolation regions;
- a first gate stack formed on the cell active region;
- a second gate stack formed on the peripheral active region;
- a cell epitaxial layer formed on an exposed portion of the cell active region and comprising an extending portion disposed on a first isolation region of the isolation regions; and
- a peripheral epitaxial layer formed on an exposed portion of the peripheral active region and comprising an extending portion disposed on a second isolation region of the isolation regions,
- wherein the height of the peripheral epitaxial layer is greater than the height of the cell epitaxial layer, and the horizontal length of the extending portion of the cell epitaxial layer is shorter than the horizontal length of the extending portion of the peripheral epitaxial layer in proportion to the height of the peripheral epitaxial layer being greater than the height of the cell epitaxial layer.

7. The semiconductor device of claim 6, wherein the height of the cell epitaxial layer is about 200 to 400 Å.

8. The semiconductor device of claim 6, wherein the horizontal length of the extending portion of the cell epitaxial layer is about 20 to 100 Å.

9. The semiconductor device of claim 6, wherein the height of the peripheral epitaxial layer is about 300 to 500 Å.

10. The semiconductor device of claim 9, wherein the horizontal length of the extending portion of the peripheral epitaxial layer is about 50 to 150 Å.

* * * * *